United States Patent
Binder et al.

(10) Patent No.: US 12,284,823 B1
(45) Date of Patent: Apr. 22, 2025

(54) BURIED FIELD SHIELD IN III-V COMPOUND SEMICONDUCTOR TRENCH MOSFETS VIA ETCH AND REGROWTH

(71) Applicants: National Technology & Engineering Solutions of Sandia, LLC, Albuquerque, NM (US); James A. Cooper, Santa Fe, NM (US)

(72) Inventors: Andrew Binder, Albuquerque, NM (US); James A. Cooper, Santa Fe, NM (US)

(73) Assignees: National Technology & Engineering Solutions of Sandia, LLC, Albuquerque, NM (US); James Cooper, Santa Fe, NM (US)

( * ) Notice: Subject to any disclaimer, the term of this patent is extended or adjusted under 35 U.S.C. 154(b) by 421 days.

(21) Appl. No.: 17/830,624

(22) Filed: Jun. 2, 2022

Related U.S. Application Data

(60) Provisional application No. 63/208,119, filed on Jun. 8, 2021.

(51) Int. Cl.

| | |
|---|---|
| *G01S 7/481* | (2006.01) |
| *G01S 17/894* | (2020.01) |
| *G03B 30/00* | (2021.01) |
| *H01L 21/76* | (2006.01) |
| *H01L 21/761* | (2006.01) |
| *H04N 13/239* | (2018.01) |
| *H04N 23/51* | (2023.01) |
| *H04N 23/56* | (2023.01) |
| *H04N 23/74* | (2023.01) |

(Continued)

(52) U.S. Cl.
CPC ....... *H10D 62/109* (2025.01); *H01L 21/7605* (2013.01); *H01L 21/761* (2013.01); *H10D 30/021* (2025.01); *H10D 30/0297* (2025.01); *H10D 30/668* (2025.01); *H10D 62/393* (2025.01); *H10D 62/8503* (2025.01)

(58) Field of Classification Search
CPC ............ H01L 29/2003; H01L 21/0254; H01L 21/02458; H01L 29/66462; H01L 29/66734; H01L 29/7813; H01L 29/4236; H01L 29/7397; H01L 21/7605; H01L 29/407; H01L 29/0623; H01L 21/761; H10D 30/668; H10D 30/0297; H10D 62/107; H10D 64/117; H10D 62/109
See application file for complete search history.

(56) References Cited

U.S. PATENT DOCUMENTS

| | | |
|---|---|---|
| 6,180,958 B1 | 1/2001 | Cooper, Jr. |
| 7,427,800 B2 | 9/2008 | Yilmaz |

(Continued)

*Primary Examiner* — John A Bodnar
(74) *Attorney, Agent, or Firm* — Kevin W. Bieg

(57) ABSTRACT

The present invention is directed to III-V semiconductor trench MOSFETs comprising a buried field shield. The invention is further directed to an etch and regrowth method for forming this buried field shield. For example, in III-V trench MOSFETs with an n-type substrate, the region can be formed by an etch into the drift (n-type) and regrowth of p-type semiconductor to form the buried field shield in the trench area and a body/channel outside the trench area. With a narrow trench feature size, the regrowth will planarize enabling subsequent source epitaxy (n-type) without requiring ex-situ processing between body/channel and source growths, eliminating the need for additional masking of the regrowth.

13 Claims, 5 Drawing Sheets

(51) Int. Cl.
*H10D 30/01* (2025.01)
*H10D 30/66* (2025.01)
*H10D 62/10* (2025.01)
*H10D 62/17* (2025.01)
*H10D 62/85* (2025.01)

(56) References Cited

U.S. PATENT DOCUMENTS

| | | |
|---|---|---|
| 10,192,982 B2 | 1/2019 | Yilmaz et al. |
| 10,319,829 B2 | 6/2019 | Bour et al. |
| 2017/0040425 A1* | 2/2017 | Kueck ................. H01L 29/0619 |

* cited by examiner

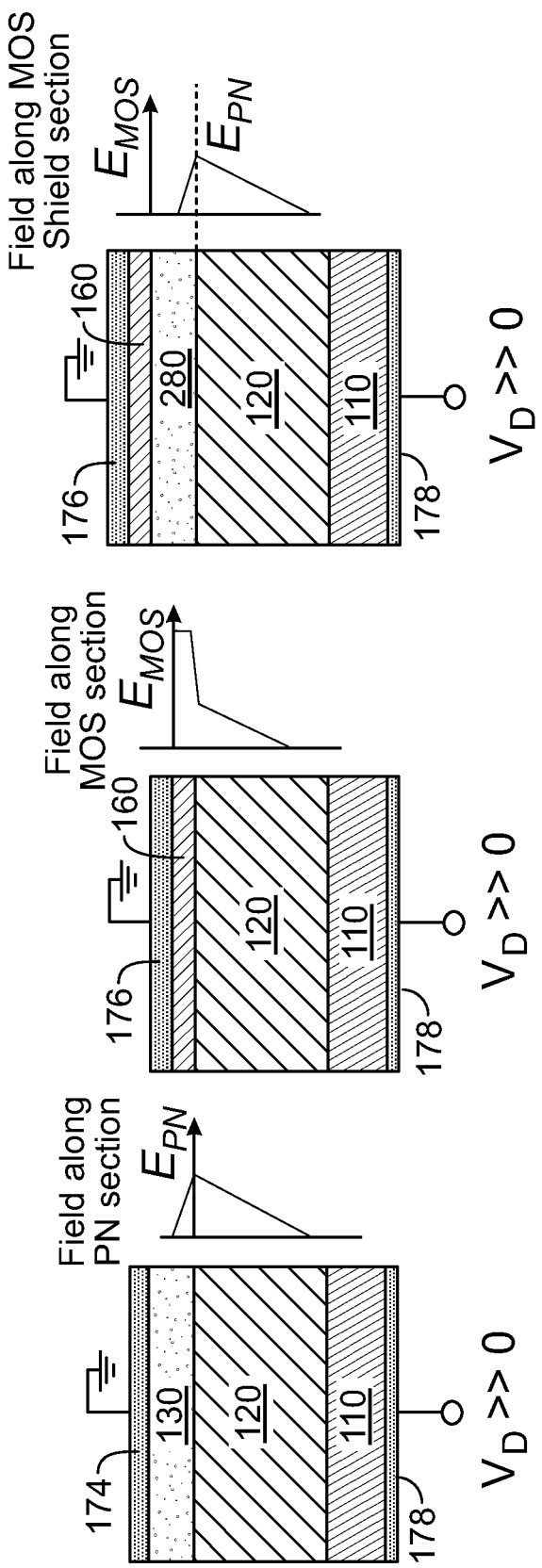

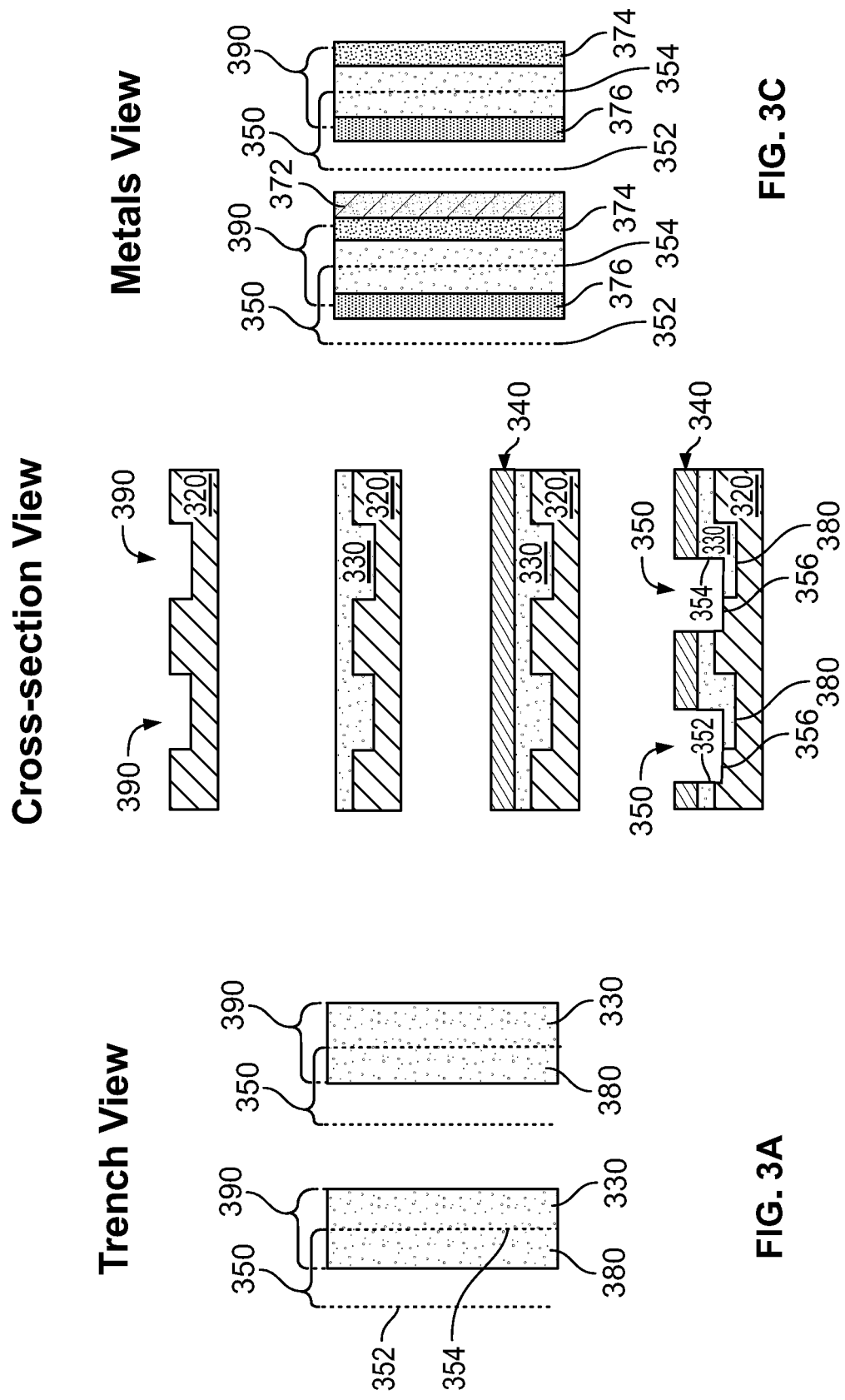

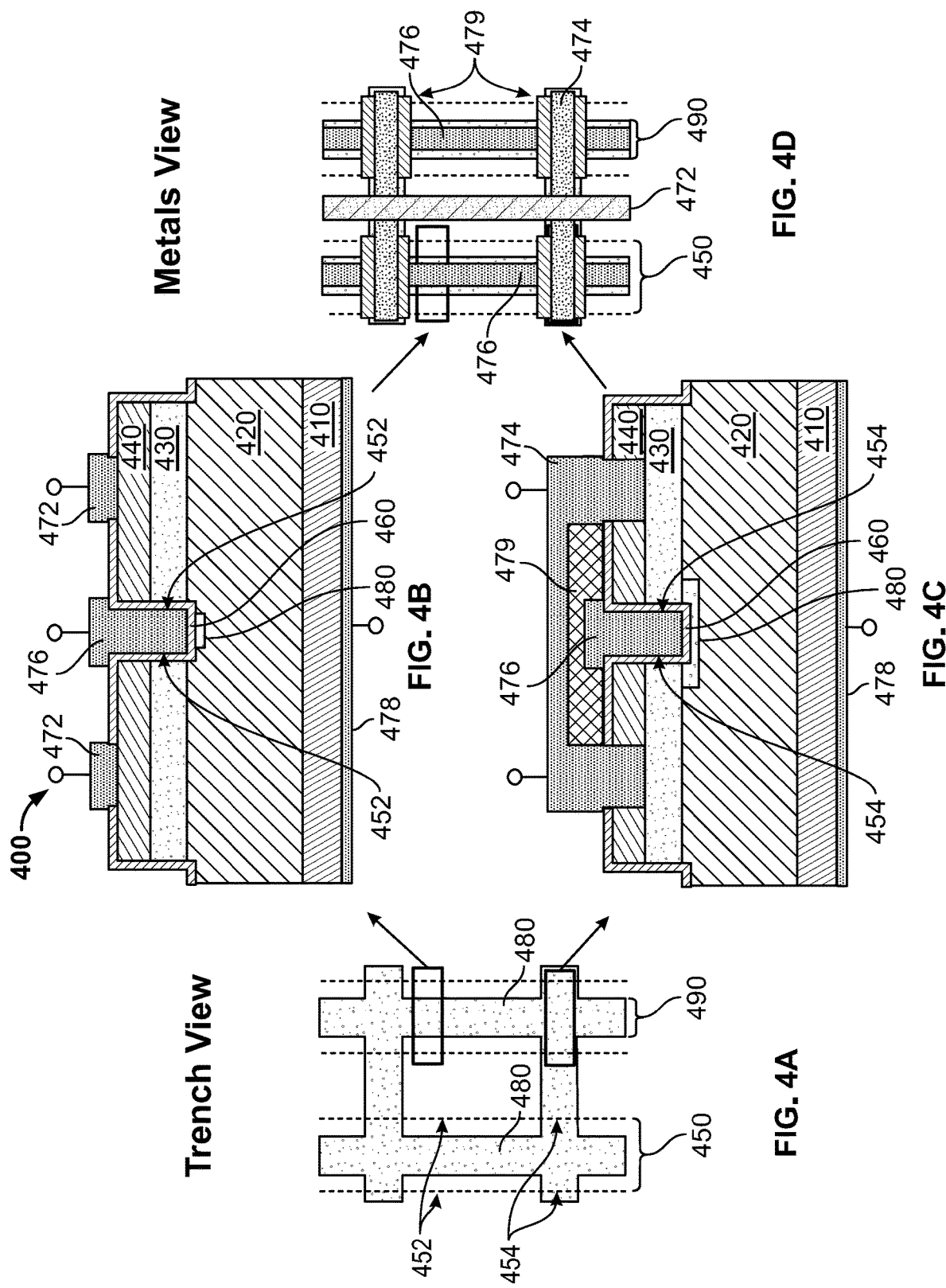

BURIED FIELD SHIELD IN III-V COMPOUND SEMICONDUCTOR TRENCH MOSFETS VIA ETCH AND REGROWTH

CROSS-REFERENCE TO RELATED APPLICATION

This application claims the benefit of U.S. Provisional Application No. 63/208,119, filed Jun. 8, 2021, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

This invention relates in general to semiconductor power field-effect transistors and, in particular, to III-V compound semiconductor trench metal-oxide-semiconductor field-effect transistor (MOSFET) devices and methods for forming such devices to improve breakdown performance and increase packing/cell density.

BACKGROUND OF THE INVENTION

Trench-type power MOSFET devices are widely used as power switches in electronic applications. In contrast to the planar power MOSFET configuration, the trench MOSFET gate structure is formed in a trench which minimizes cell pitch and enables both a reduction in on-state resistance and total area. However, protection of the dielectric at the bottom of the trench becomes a concern with a trench-gated device, as high electric fields in the blocking off-state can cause dielectric breakdown leading to a gate-to-drain short under high drain bias. The dielectric at the trench bottom can be protected by a buried field shield, a region that is doped opposite to the conductivity of the substrate and is located below or adjacent to the gate. This buried layer should be electrically tied to the body and acts to form a PN junction below the gate, serving to reduce the voltage dropped across the dielectric. In Si or SiC devices, the buried field shield can be implemented by selective area ion implantation to create a region which not only protects the dielectric at the bottom of the trench but also forms a highly doped contact region at the semiconductor surface which serves as the body contact. See U.S. Pat. No. 6,180,958 to Cooper, issued Jan. 30, 2001; U.S. Pat. No. 7,427,800 to Yilmaz, issued Sep. 23, 2008; and U.S. Pat. No. 10,192,982 to Yilmaz et al., issued Jan. 29, 2019.

However, a need remains for a buried field shield for III-V compound semiconductor MOSFETs. In particular, limitations in selective area ion implantation for III-V-based semiconductors require a different method to form a buried field shield for III-V MOSFETs.

SUMMARY OF THE INVENTION

The present invention is directed to a III-V compound semiconductor trench MOSFET, comprising a substrate comprising a III-V compound semiconductor of a first conductivity type, a drift layer comprising a III-V compound semiconductor of the first conductivity type on the substrate, a body layer comprising a III-V compound semiconductor of a second conductivity type opposite the first conductivity type on the drift layer, a source layer comprising a III-V compound semiconductor of the first conductivity type on the body layer, a gate trench defined by sidewalls and a bottom formed through the source layer and the body layer that is embedded in and terminates in the drift layer, a gate dielectric layer conformally lining the sidewalls and the bottom of the gate trench, a buried field shield comprising a III-V compound semiconductor of the second conductivity type that is positioned at least partially below the bottom of the trench and is embedded in the drift layer, thereby forming a PN junction with the drift layer, wherein the buried field shield is electrically connected to the body layer, a drain contact to the substrate, a gate contact that at least partially fills the gate trench on the gate dielectric layer, a source contact contacting the source layer, and a body contact made through the source layer and electrically contacting the body layer.

The invention is further directed to a III-V compound semiconductor trench MOSFET as described above except that a pair of source contacts run parallel to and on opposite sides of the gate contact and electrically contact the source layer on opposite sides of the gate contact and at least one body contact runs perpendicular to the gate contact and electrically contacts the body layer on opposite sides on the gate contact and wherein the buried field shield is wider than the bottom of the gate trench under the at least one body contact and is narrower than the bottom of the gate trench in the remaining portions of the gate trench.

The invention is further directed to a method forming a III-V compound semiconductor trench MOSFET, comprising providing a substrate comprising a III-V compound semiconductor of a first conductivity type, growing a drift layer comprising a III-V compound semiconductor of the first conductivity type on the substrate, etching a shield trench in the surface of the drift layer, regrowing a body layer comprising a III-V compound semiconductor of a second conductivity type opposite the first conductivity type on the etched shield trench and unetched surface of the drift layer to provide a planarized body layer, forming a source layer of a III-V compound semiconductor of the first conductivity type on the body layer, etching a gate trench defined by sidewalls and a bottom through the source layer and terminating in at least a portion of the body layer regrown in the etched shield trench, lining the sidewalls and bottom of the gate trench with a gate dielectric layer, wherein the portion of the regrown body layer beneath the gate dielectric layer provides a buried field shield that forms a PN junction with the drift layer, forming a drain contact to the substrate, forming a gate contact that at least partially fills the gate trench on the gate dielectric layer, forming a source contact to the source layer, and forming a body contact through the source layer and electrically contacting the body layer.

BRIEF DESCRIPTION OF THE DRAWINGS

The detailed description will refer to the following drawings, wherein like elements are referred to by like numbers.

FIG. 2A shows the electric field profile for a PN junction. FIG. 2B shows the electric field profile for a MOS capacitor, representing the bottom of the gate trench. FIG. 2C shows the electric field profile for a MOS section with a field shield, representing the bottom of the trench when shielded.

FIGS. 3A-D illustrate a MOSFET comprising an offset buried field shield with a single active sidewall formed by an etch and regrowth method. FIG. 3A shows a top trench view. FIG. 3B illustrates an etch and regrowth method to form an offset buried field shield. FIG. 3C shows a top metals view after deposition of the gate, body, and source contacts. FIG. 3D is a cross-section illustration of the MOSFET comprising an offset buried field shield. Metal electrode are portrayed, however the top metal contact is not depicted.

FIGS. 4A-D illustrate a MOSFET comprising a segmented body and source contacts formed by an etch and regrowth. FIG. 4A shows a top trench view. FIG. 4B shows a cross-section view of the source contact region. FIG. 4C shows a cross-section view of the body contact region. FIG. 4D shows a top metals view after deposition of the gate, body, and source contacts in which the bond contact runs perpendicular to the source contact. Metal electrode are portrayed, however the top metal contact is not depicted.

DETAILED DESCRIPTION OF THE INVENTION

This invention is directed to a buried field shield in III-V semiconductor power trench MOSFETs. Additionally, the invention is further directed to methods for the fabrication of a buried field shield in III-V trench MOSFETs by etch and regrowth. The purpose of the buried field shield is to protect the gate dielectric at the bottom of the MOSFET gate trench from high fields during the blocking off-state.

Figure 1A:
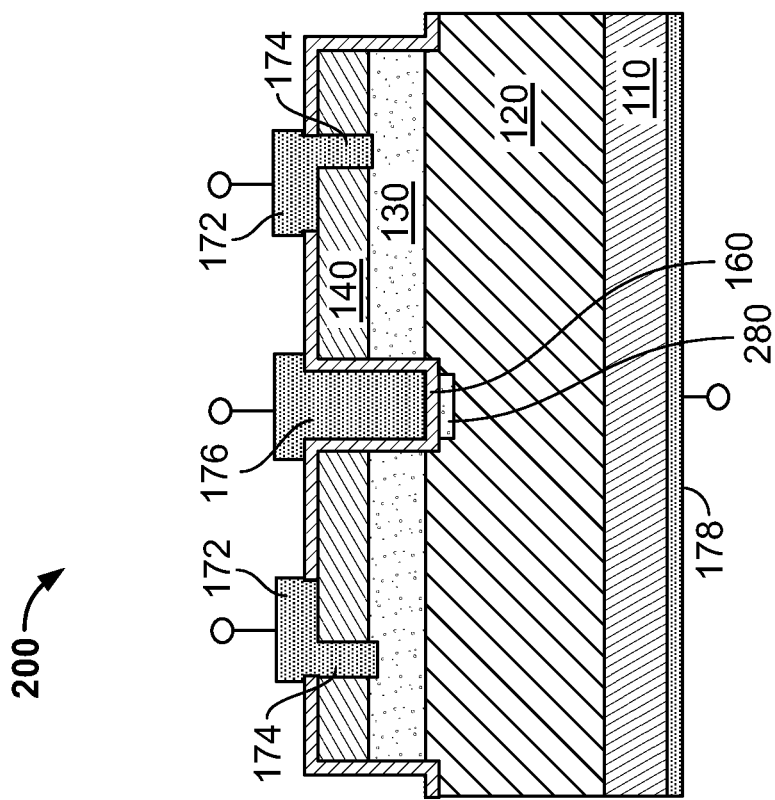
FIG. 1A is a schematic illustration of a conventional GaN trench MOSFET with no field shield.
Figure 1B:
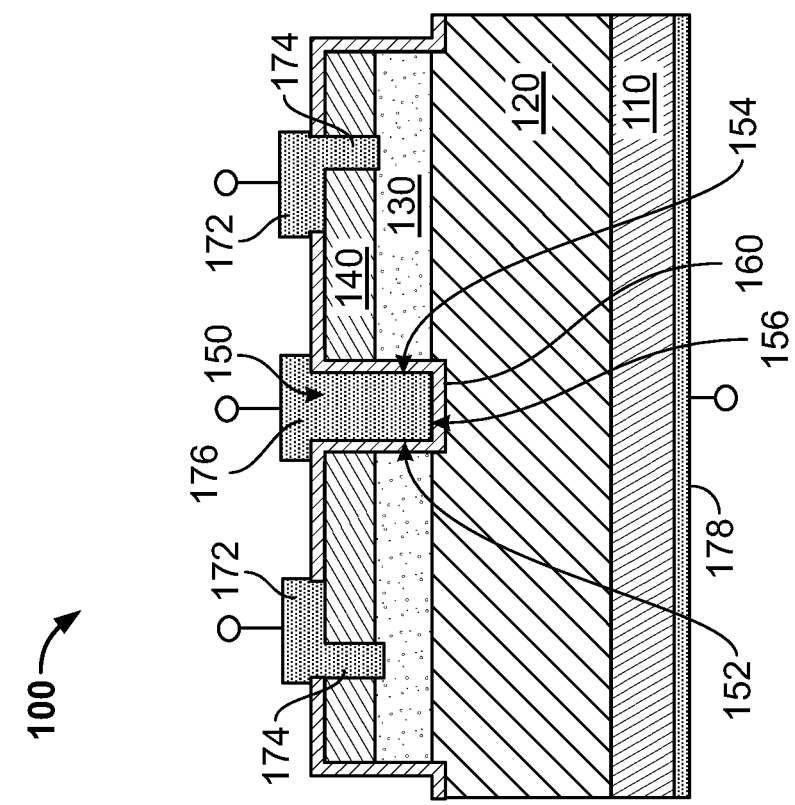
FIG. 1B is a schematic illustration of a GaN trench MOSFET with a buried field shield designed to protect the gate dielectric. Metal electrode are portrayed, however the top metal contact is not depicted.

A conventional GaN trench MOSFET without a field shield is depicted in FIG. 1A. The conventional GaN trench MOSFET 100 comprises a thick, low-doped n-type GaN drift layer 120 epitaxially grown on a heavily doped n-type GaN substrate 110, a p-type GaN body layer 130 epitaxially grown on the drift layer 120, and a heavily doped n-type GaN source layer 140 epitaxially grown on the body layer 130. A gate trench 150 defined by sidewalls 152, 154 and a trench bottom 156 extends through the $n^+$ source and p-type body layers 140, 130 and terminates in the n drift layer 120. The gate trench can have vertical or substantially vertical sidewalls and a flat or substantially flat trench bottom, although other trench geometries are possible. For example, the trench can have angled sidewalls (e.g., at 60° in the A- or M-crystal plane) and/or a rounded bottom. A thin gate dielectric (e.g., $Al_2O_3$) layer 160 conformally lines the sidewalls 152, 154 and bottom 156 of the trench 150. Respective ohmic electrical contacts can define the source 172, body 174, gate 176, and drain 178. The source contact 172 is made to the surface of the $n^+$ source layer 140 and the body contact 174 is made through the $n^+$ source layer 140 to contact the p-type body layer 130. Although the source and body contacts are separate metallizations, they are connected by an overlapped metallization. The gate electrode 176 lines the trench 150 on the gate dielectric layer 160. The drain contact 178 is made to the n-type substrate 110. In the on-state, conduction is primarily vertical, wherein electrons flow from the $n^+$ source, across a sidewall channel in the p-type body adjacent to the gate and into the n-type drift layer before reaching the $n^+$ substrate and drain contact. In the blocking off-state under high drain bias the electric field lines will pass through the gate dielectric under the trench as the gate dielectric is not fully protected by the depletion region formed by the PN junction (the body and drift junction). This causes premature breakdown when the field in the dielectric exceeds the materials breakdown strength, causing a gate dielectric rupture and a short from gate to drain. FIG. 1B shows a GaN trench MOSFET 200 of the present invention, wherein the addition of a p-type GaN region 280 under the gate dielectric 160, with the p-type region 280 being electrically tied to the body 130 potential, forms a PN junction with the n-type drift layer 120 that reduces the field strength in the dielectric 160 in the blocking off-state. This p-type region 280 under the gate 176 is known as a buried field shield, and the shape and design of this region can take many forms, but the general purpose remains to protect the gate dielectric 160 in the blocking state from high electric fields.

The electric field profile can be approximated by three primary regions in a trench MOSFET: the field at the edge or periphery of the device, the field under the body PN junction (between the body and the drift), and the field under the gate trench. In the blocking state under high bias ($V_D >> 0$), the field at the periphery needs to be managed by a field termination and the field under the PN junction, as depicted by the $E_{PN}$ field profile in the PN Junction illustration shown in FIG. 2A, is supported by the junction and can sustain up to the critical electric field ($E_{crit}$) of the material. However, the field crowding under the gate trench, especially at the trench corners, can result in 2-3 times higher field in the gate dielectric compared to the field in the drift, as depicted by the $E_{MOS}$ field profile in the MOS Section illustration shown in FIG. 2B. With a buried field shield, the high electric field in the blocking-state can be supported by the PN junction below the gate, with a very small potential drop occurring in the dielectric, as shown in the MOS Section with Shield illustration in FIG. 2C.

Due to limitations in selective area doping in GaN and other III-V semiconductors, the formation of a buried field shield becomes a more challenging process than with SiC devices. Therefore, according to the present invention, a buried field shield can be formed in III-V semiconductors, including GaN, by etch and regrowth of a p-type region under the gate trench. See U.S. Pat. No. 10,319,829 to Bour et al., issued Jun. 11, 2019. This buried shield can be comprised of a region doped opposite the conductivity of the drift region that is electrically tied to the body. The shield formed by etch and regrowth is located beneath the gate dielectric but otherwise can take many forms. Two examples are described below.

Figure 3D:
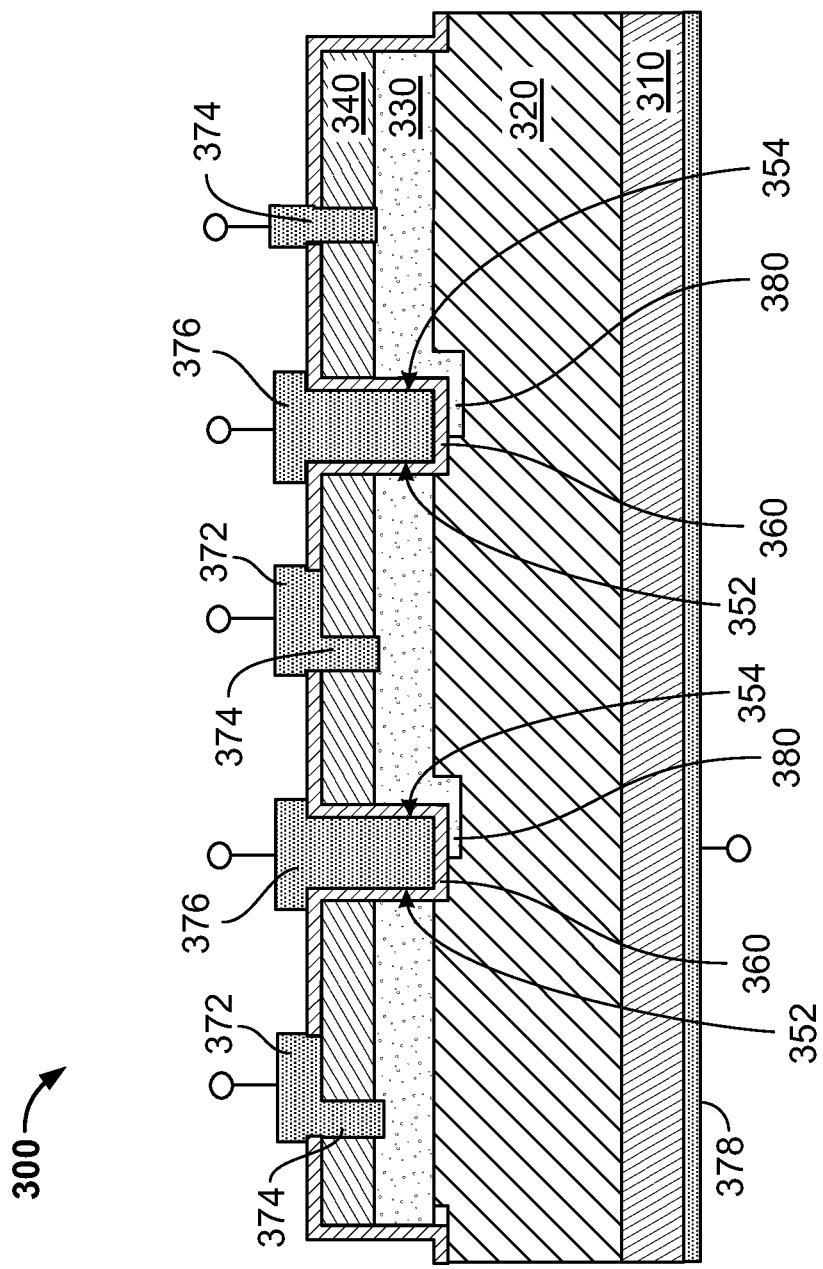

An exemplary GaN trench MOSFET 300 and method for fabricating an offset buried field shield with a single active sidewall via etch and regrowth is illustrated in FIGS. 3A-D. As shown in FIG. 3B, the method begins with a masked etch to form shield trenches 390 in the n-drift layer 320 epitaxially grown on the heavily doped n-type GaN substrate 310. Next, a p-type base or body layer 330 is regrown on the exposed n drift layer 320. The epitaxy of the p-type base can be controlled in such a way that the p-layer will planarize during growth, although other methods can be employed to planarize the body layer. Next, an $n^+$ source layer 340 can be grown on the planarized p-body layer 330. Alternatively, the $n^+$ source layer can be formed by ion implantation of an n-type dopant (e.g., with $Si^+$) into the top of the p-body layer. Following the source formation, another etch is performed to form the gate trench 350, this gate trench etch 350 can be offset from the shield etch 390 so that the buried field shield 380 only covers a portion of the bottom 356 of the gate trench 350 and wraps around one side of the trench to be physically continuous with the p-body layer 330, as shown in FIGS. 3B and 3D. Indeed, the buried field shield will offer some protection, even if it only covers a sidewall of the trench where it is embedded in the drift layer. In this way, a double channel MOSFET now only has one active sidewall 352 channel and the other sidewall is an inactive sidewall 354, as depicted in FIG. 3A. There will be no or limited current flow along the inactive sidewall 354 due to the significantly longer channel length along this sidewall. Conversely, the active sidewall 352 provides a channel for current flow. With this method, the the top metal contacts to the gate 376, source 372, and body 374 can be laid out as shown in FIGS. 3C and 3D, with no need to have a source/body/source metal configuration as is common for double channel devices. Instead, the body contact 374 can be laid out on the side of the inactive sidewall 354 and the source contact 372 can be on the side of the active sidewall 352. The offset approach to forming the buried field shield via etch and regrowth allows the field shield to be electrically connected to the body region through the epilayer without the need of an additional metal layer to form the connection. As before, a drain contact 378 can be made to the n-type substrate 310.

Another exemplary GaN trench MOSFET 400 to further improve cell pitch is to employ a segmented body and source contact, as shown in FIGS. 4A-C. The heavily doped n-type GaN substrate 410, n drift layer 420, p-body layer 430, and n$^+$ source layer 440 can be fabricated as described above. The segmented contact approach enables a source/gate/source layout that saves space by running the body contact 474 perpendicular to the source 472 and gate 476 contacts (rather than running the contacts in parallel). This approach takes full advantage of the double channel device, using both active sidewalls 452 for the majority of the device length, and roughly 10% of the length can be devoted to a body contact where both channels would be inactive 454, as depicted in FIG. 4A. This method of fabrication of the buried field shield 480 is similar to the previous etch and regrowth approach with the exception that the shield etch 490 is not offset from the gate trench etch 450, but rather it is centered and, for the majority of the length, the field shield 480 is narrower than the gate trench 450, as shown in FIG. 4B. Because the previously inactive sidewall is no longer enclosed in p-type material, current can flow through the channel and pass vertically through the device in the source regions. Therefore, in this source region, there are two active sidewalls 452 and no physical body contact, although the p-type body is still electrically connected to the body contact. As shown in FIG. 4C, for a short length the field shield 480 should be wider than the gate trench 450 to tie the shield 480 physically and electrically to the body 430. In the body regions under the body contacts, both gate sidewalls will be inactive, because the gate 476 is totally enclosed in p-type material and no current can flow even if a channel is formed. The advantage of this segmented approach is to improve the cell pitch and the active channel length per unit area. The increase in active channel length per unit area has already been explained, however, the decrease in cell pitch comes due to running the body contact 474 perpendicular to the source 472 and gate 476 contacts, as shown in FIG. 4D. In this region, the body contact 474 and be insulated from the gate contact 476 by a dielectric 479 (e.g., SiN). In this way the device does not need a source/body/source contact layout but can use just one source contact 472 between parallel gate contacts 476. As before, a drain contact 478 can be made to the n-type substrate 410.

The above examples are directed to GaN devices. However, the devices can be fabricated using other III-V compound semiconductors, including binary, ternary, and quaternary and higher alloys of Al, Ga, and/or In with N, P, As, and/or Sb. Finally, the semiconductor layers can be grown in reverse, making the drift layer p-type and the buried field shield n-type.

The present invention has been described as a buried field shield in III-V compound semiconductor trench MOSFETs via etch and regrowth. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A III-V compound semiconductor trench MOSFET, comprising:
   a substrate comprising a III-V compound semiconductor of a first conductivity type,
   a drift layer comprising a III-V compound semiconductor of the first conductivity type on the substrate,
   a body layer comprising a III-V compound semiconductor of a second conductivity type opposite the first conductivity type on the drift layer,
   a source layer comprising a III-V compound semiconductor of the first conductivity type on the body layer,
   a gate trench defined by sidewalls and a bottom formed through the source layer and the body layer that is embedded in and terminates in the drift layer,
   a gate dielectric layer conformally lining the sidewalls and the bottom of the gate trench,
   a buried field shield comprising a III-V compound semiconductor of the second conductivity type that is positioned at least partially below the bottom of the trench and is embedded in the drift layer, thereby forming a PN junction with the drift layer, wherein the buried field shield is electrically connected to the body layer and terminates at the source layer,
   a drain contact to the substrate,
   a gate contact that at least partially fills the gate trench on the gate dielectric layer,
   a source contact to the source layer, and
   a body contact made through the source layer and contacting the body layer.

2. The III-V compound semiconductor trench MOSFET of claim 1, wherein the buried field shield covers a portion of the trench bottom that is offset from the center of the gate trench and wraps around one sidewall of the gate trench to be physically continuous with the body layer.

3. The III-V compound semiconductor trench MOSFET of claim 1, wherein the III-V compound semiconductor comprises at least one group III element alloyed with at least one group V element.

4. The III-V compound semiconductor trench MOSFET of claim 3, wherein the at least one group III element comprises aluminum, gallium, or indium and the at least one group V element comprises nitrogen, phosphorous, arsenic, or antimony.

5. The III-V compound semiconductor trench MOSFET of claim 4, wherein the III-V compound semiconductor comprises gallium nitride.

6. The III-V compound semiconductor trench MOSFET of claim 1, wherein the first conductivity type is n-type and the second conductivity type is p-type.

7. The III-V compound semiconductor trench MOSFET of claim 1, wherein the first conductivity type is p-type and the second conductivity type is n-type.

8. A segmented III-V compound semiconductor trench MOSFET, comprising: a substrate comprising a III-V compound semiconductor of a first conductivity type, a drain contact to the substrate, a drift layer comprising a III-V compound semiconductor of the first conductivity type on the substrate, a body layer comprising a III-V compound semiconductor of a second conductivity type opposite to the first conductivity type on the drift layer, a source layer comprising a III-V compound semiconductor of the first conductivity type on the body layer, a gate trench having a length and a width defined by sidewalls and a bottom formed through the source layer and the body layer that is embedded in and terminates in the drift layer, a gate dielectric layer conformally lining the sidewalls and the bottom of the gate trench, a rectilinear gate contact that at least partially fills the gate trench on the gate dielectric layer, a pair of rectilinear source contacts that run parallel to and on opposite sides of the rectilinear gate contact and electrically contact the source layer on opposite sides of the rectilinear gate contact, at least one rectilinear body contact that runs perpendicular to the rectilinear gate contact and electrically contacts the body layer through the source layer on opposite sides on the rectilinear gate contact, and a buried field shield comprising a III-V compound semiconductor of the second conductivity type that is positioned at least partially below the bottom of the gate trench and is embedded in the drift layer and is electrically connected to the body layer, thereby forming a PN junction with the drift layer, wherein the buried field shield is wider than the bottom of the gate trench in a portion of the length of the gate trench under the at least one body contact and is narrower than the bottom of the gate trench in the remaining length of the gate trench.

9. The III-V compound semiconductor trench MOSFET of claim 8, wherein the III-V compound semiconductor comprises at least one group III element alloyed with at least one group V element.

10. The III-V compound semiconductor trench MOSFET of claim 9, wherein the at least one group Ill element comprises aluminum, gallium, or indium the at least one group V element comprises nitrogen, phosphorous, arsenic, or antimony.

11. The III-V compound semiconductor trench MOSFET of claim 10, wherein the III-V compound semiconductor comprises gallium nitride.

12. The III-V compound semiconductor trench MOSFET of claim 8, wherein the first conductivity type is n-type and the second conductivity type is p-type.

13. The III-V compound semiconductor trench MOSFET of claim 8, wherein the first conductivity type is p-type and the second conductivity type is n-type.

\* \* \* \* \*